United States Patent
Dussarrat et al.

(10) Patent No.: US 12,065,453 B2
(45) Date of Patent: Aug. 20, 2024

(54) LANTHANOID COMPOUND, LANTHANOID-CONTAINING THIN FILM AND FORMATION OF LANTHANOID-CONTAINING THIN FILM USING THE LANTHANOID COMPOUND

(71) Applicant: L'Air Liquide, Société Anonyme pour l'Etude et l'Exploitation des Procédés Georges Claude, Paris (FR)

(72) Inventors: Christian Dussarrat, Tokyo (JP); Takashi Ono, Yokosuka (JP); Tomohiro Seki, Yokosuka (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 1062 days.

(21) Appl. No.: 16/964,811

(22) PCT Filed: Jan. 22, 2019

(86) PCT No.: PCT/EP2019/051459
§ 371 (c)(1),
(2) Date: Jul. 24, 2020

(87) PCT Pub. No.: WO2019/145277
PCT Pub. Date: Aug. 1, 2019

(65) Prior Publication Data
US 2021/0061833 A1 Mar. 4, 2021

(30) Foreign Application Priority Data
Jan. 26, 2018 (JP) .................................. 2018-011070

(51) Int. Cl.
*C07F 17/00* (2006.01)
*C23C 16/34* (2006.01)
*C23C 16/40* (2006.01)
*C23C 16/455* (2006.01)
*H01L 21/02* (2006.01)

(52) U.S. Cl.
CPC .............. *C07F 17/00* (2013.01); *C23C 16/34* (2013.01); *C23C 16/40* (2013.01);
(Continued)

(58) Field of Classification Search
None
See application file for complete search history.

(56) References Cited

U.S. PATENT DOCUMENTS 7,759,746 B2 7/2010 Clark
8,747,965 B2 6/2014 Mogi et al.
(Continued)

FOREIGN PATENT DOCUMENTS

WO WO 2009 057058 5/2009
WO WO 2009 149372 12/2009

OTHER PUBLICATIONS

Chen, J. et al., Photofragmentation of gas-phase lanthanide cyclopentadienyl complexes: experimental and time-dependent excited-state molecular dynamics, Organometallics 2014, 33, 1574-1586.
(Continued)

Primary Examiner — Hsien Ming Lee
(74) Attorney, Agent, or Firm — Allen E. White (57) ABSTRACT

The lanthanoid compound according to the present invention is a compound represented by the following general formula $Ln(R^1_xCp)_2(A)_y$, or the following general formula $Sm(R^2_xCp)_2(A)_y$. In $Ln(R^1_xCp)_2(A)_y$, Ln is Nd, Eu, Dy, Tm, or Yb, $R^1$ is independently Me, Et, $^nPr$, $^iPr$, $^nBt$, $^sBu$, $^iBu$, or $^tAm$, Cp is cyclopentadienyl, A is a linear or cyclic hydrocarbon containing oxygen, sulfur, phosphorus, or nitrogen, x is an integer of 2 to 3, and y is 0 to 2. In $Sm(R^2_xCp)_2(A)_y$, $R^2$ is independently $^nPr$, $^iPr$, $^nBt$, $^sBu$, $^iBu$, or $^tAm$.

13 Claims, 5 Drawing Sheets (52) U.S. Cl.
CPC .... *C23C 16/45553* (2013.01); *H01L 21/0254* (2013.01); *H01L 21/0262* (2013.01)

(56) References Cited

U.S. PATENT DOCUMENTS

| | | | |
|---|---|---|---|
| 9,711,347 B2* | 7/2017 | Pallem | H01L 21/02192 |
| 2015/0093843 A1* | 4/2015 | Min | H01L 33/50 |
| | | | 438/27 |
| 2016/0149249 A1* | 5/2016 | Pozvonkov | H01M 8/1016 |
| | | | 429/490 |
| 2016/0315168 A1* | 10/2016 | Dussarrat | H01L 29/517 |
| 2018/0037017 A1* | 2/2018 | Sato | B32B 27/281 |
| 2018/0119274 A1 | 5/2018 | Harada et al. | |

OTHER PUBLICATIONS

Jaroschik, F. et al., Synthesis of a new stable, neutral organothulium(II) complex by reduction of a thulium(III) precursor, Chem. Commun. 2006, 426-428.

Nocton, G. et al., N-aromatic heterocycle adducts of bulky [1,2,4-Me$_3$C)$_3$C$_5$H$_2$]$_2$Sm: synthesis, structure and solution analysis, Dalton Transactions 2014, 43, 4380-4387.

Weber, F. et al., Synthesis and solid state structures of sterically crowded d$^0$-metallocenes of magnesium, calcium, strontium, barium, samarium, and ytterbium, Organometallics 2002, 21, 3139-3146.

Lisheng, M. et al., Synthesis of bis(methylcyclopentadienyl) (piperidino)lanthanoids and their catalytic behavior for polymerization of methyl methacrylate, Journal of Organometallic Chemistry, vol. 566, No. 1-2, Sep. 15, 1998, 9-14.

Pushkarevsky, N.A. et al., Different reductive reactivities of SmCp$^x_2$(THF)$_n$ (Cp$^x$=C$_5$Me$_5$ and C$_5$H$_3{}^t$Bu$_2$) samarocenes toward P$_2$Ph$_4$: THF ring-opening and ligand-exchange pathways, Organometallics 2017, 36, 1287-1295.

International Search Report and Written Opinion for corresponding PCT/EP2019/051459, Mar. 14, 2019.

* cited by examiner

LANTHANOID COMPOUND, LANTHANOID-CONTAINING THIN FILM AND FORMATION OF LANTHANOID-CONTAINING THIN FILM USING THE LANTHANOID COMPOUND

CROSS REFERENCE TO RELATED APPLICATIONS

This application is a 371 of International Application No, PCT/EP2019/051459, filed Jan. 22, 2019, which claims priority to Japanese Patent Application No. JP 2018-011070, filed Jan. 26, 2018, the entire contents of which are incorporated herein by reference.

BACKGROUND

Technical Field

The present invention relates to a lanthanoid compound, a lanthanoid-containing thin film, and formation of a lanthanoid-containing thin film using the lanthanoid compound.

Prior Art

Lanthanoids exhibit unique physical properties based on different electron configurations from normal elements, and have various applications in electronics and luminescent and optical devices. These elements can be used as powders or thin films depending on the device size.

For example, europium-containing thin films have been known in which europium is added to a gate insulating film or an optical material (for example, Patent Literature 1).

U.S. Pat. No. 7,759,746 has disclosed a trivalent cyclopentadienyl-based lanthanoid compound or a divalent cyclopentadienyl-based lanthanoid compound as a precursor used when forming such a europium-containing thin film by chemical vapor deposition (hereafter abbreviated CVD) or atomic layer deposition (hereafter abbreviated ALD).

Tris(cyclopentadienyl)europium (hereafter abbreviated $EuCp_3$) has been disclosed as an example of a trivalent cyclopentadienyl-based lanthanoid compound.

$Eu(Me_5Cp)_2$ has been disclosed as an example of a divalent cyclopentadienyl-based lanthanoid compound.

U.S. Pat. No. 8,747,965 has disclosed $Eu(Me_4RCp)_2$ (R is ethyl, normal propyl, normal butyl, or normal pentyl), a divalent cyclopentadienyl-based lanthanoid compound in which the methyl comprising one of the side chains of the cyclopentadienyl in $Eu(Me_5Cp)_2$ is substituted with a long-chain alkyl.

When supplied, however, the trivalent lanthanoid compound having cyclopentadienyl disclosed by U.S. Pat. No. 7,759,746 is mostly a solid, which is difficult to handle. The trivalent lanthanoid compound having cyclopentadienyl also has low thermal stability.

In the case that the cyclopentadienyl in the lanthanoid compound is not substituted or has one substituent, the compound tends to form a polymer. The vapor pressure usually falls when a polymer is formed, making it difficult to ensure the quantity of vapor required to form a lanthanoid-containing thin film.

In the case that the compound has four or five side chains, however, the vapor pressure tends to fall and the melting point tends to increase. The heating temperature of the ingredient vessels and pipes used in CVD or ALD is usually set at no higher than a specified temperature (for example, 180° C.) due to issues related to the heat resistance of valves and other parts. In the case that the vapor pressure falls, sufficient lanthanoid compound vapor cannot be supplied to a substrate at a specified temperature and film-forming speed is reduced, which causes the problem of reduced throughput. In the case that the melting point is high and the lanthanoid compound is a solid at the supply temperature, it is difficult to supply the lanthanoid compound stably.

Although it has a low melting point, the divalent cyclopentadienyl-based lanthanoid compound disclosed by U.S. Pat. No. 8,747,9 has the problem of a low vapor pressure because one of the five substituents on the cyclopentadienyl is a long-chain alkyl. Hence, although it can be supplied in a liquid state, it is difficult to supply vapor in the quantity required to obtain a sufficient film-forming speed. Therefore, these lanthanoid compounds are not suitable for forming a lanthanoid-containing thin film.

In view of the above, a lanthanoid compound for forming a lanthanoid-containing thin film is sought that has sufficient vapor pressure and can be used in a liquid state by having a lower melting point than the temperature when supplied.

Notations, Nomenclature, and Abbreviations

Notations, nomenclature, and several abbreviations, symbols, and terms will be used throughout the specification hereinafter and the claims.

When used in the present specification, the term "alkyl" indicates a saturated or unsaturated functional group containing only carbon and hydrogen atoms. The term "alkyl" indicates a linear, branched, or cyclic alkyl. Examples of linear alkyls are methyl, ethyl, propyl, and butyl, but are not limited to these. An example of a branched alkyl is t-butyl, but is not limited to this. Examples of cyclic alkyls are cyclopropyl, cyclopentyl, and cyclohexyl, but are not limited to these. An example of a cross-linked alkyl is a vinyl configured with a single metal atom, but is not limited to this.

When used in the present specification, the abbreviation "Me" indicates methyl, the abbreviation "Et" indicates ethyl, the abbreviation "Pr" indicates an arbitrary propyl (that is, normal propyl or isopropyl), the abbreviation "$^i$Pr" indicates isopropyl, the abbreviation "Bu" indicates an arbitrary butyl (normal butyl isobutyl, tertiary butyl, or secondary butyl), the abbreviation "$^t$Bu" indicates tertiary butyl, the abbreviation "$^s$Bu" indicates secondary butyl, the abbreviation "$^i$Bu" indicates isobutyl, the abbreviation "Ln" indicates a lanthanoid, the abbreviation "THF" indicates tetrahydrofuran, the abbreviation "TMEDA" indicates tetramethylethylenediamine, and the abbreviation "DME" indicates dimethoxyethane.

The present specification uses the usual abbreviations for elements in the periodic table of elements. In some cases, elements are identified by these abbreviations (for example, Nd indicates niobium, Eu indicates europium, Sm indicates samarium, Dy indicates dysprosium, Tm indicates thulium, and Yb indicates ytterbium).

The present invention was developed to solve at least some of the problems described earlier, and can be achieved as the following modes or application examples.

Application Example 1

The lanthanoid compound according to the present invention is a compound represented by the following general formula (1).

$$Ln(R^1{}_xCp)_2(A)_y \qquad (1)$$

(In the general formula (1):
Ln is Nd, Eu, Dy, Tm, or Yb;
$R^1$ is independently methyl, ethyl, normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

Application Example 2

The lanthanoid compound according to the present invention is also a compound represented by the following general formula (2).

$$Sm(R^2{}_xCp)_2(A)_y \qquad (2)$$

(In the general formula (2):
$R^2$ is independently normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

The lanthanoid compound of Application Example 1 or 2 has a valence of two, and has two or three substituents on the cyclopentadienyl. The lanthanoid compound may have a linear or cyclic hydrocarbon containing oxygen, sulfur, phosphorus, or nitrogen as an adduct.

The lanthanoid compound is a divalent lanthanoid compound, and therefore has a lower melting point than a trivalent lanthanoid compound. The compound also tends to have a higher vapor pressure than a trivalent lanthanoid compound.

The melting point of the lanthanoid compound is preferably 180° C. or lower, more preferably 120° C. or lower, and even more preferably 80° C. or lower.

The vapor pressure of the lanthanoid compound is preferably 0.5 Torr or higher at 170° C.

The lanthanoid compound is preferably a lanthanoid compound that does not form a polymer. The lanthanoid compound resists forming a polymer compared with a lanthanoid compound having no or one substituent on the cyclopentadienyl. Therefore, there is little risk of forming a polymer during the processes of synthesis, transport, and supply of the lanthanoid compound, and because the vapor pressure is not reduced by forming a polymer, the quantity of vapor required to obtain a sufficient film-forming speed can be supplied.

The lanthanoid compound has a low molecular weight and a high vapor pressure compared with a lanthanoid compound having a valence of two and four or five substituents on the cyclopentadienyl.

To obtain the desired vapor pressure, the substituents on the cyclopentadienyl are preferably alkyls having five or fewer carbons. This is because the vapor pressure tends to fall if the substituents on the cyclopentadienyl have more than five carbons.

Application Example 3

The lanthanoid compound of Application Example 1 or 2 may be $Sm(^iPr_3Cp)_2$, $Eu(^iPr_3Cp)_2$, $Tm(^iPr_3Cp)_2$, or $Yb(^iPr_3Cp)_2$.

According to these application examples, the lanthanoid compound has especially high thermal stability and sufficient vapor pressure. The lanthanoid compound is also a liquid state at the temperature at which the lanthanoid compound is usually supplied (for example, 80° C.). As a result, the lanthanoid compound according to these application examples is especially advantageous as a material for forming a lanthanoid-containing thin film.

Application Example 4

The lanthanoid compound of Application Example 1 or 2 may be a material for forming a lanthanoid-containing thin film for production of a semiconductor device.

In the case that Ln is Nd, Eu, Sm, Dy, Tm, or Yb and the compound has cyclopentadienyl, the lanthanoid-containing thin film is highly reactive with water or oxygen. This appears to be because the cyclopentadienyl is readily desorbed. Therefore, in the case that the lanthanoid compound according to the present application example is used to form an oxide film, the water or oxygen may be used as an oxidizer. By using water or oxygen, which have lower activity than ozone or the like, as an oxidizer, damage to a device during film formation can be reduced and the film-forming step can be controlled with greater precision.

The cyclopentadienyl and its substituents in the lanthanoid compound according to the present application example comprise hydrogen and carbon atoms. A thin film obtained by film formation does not contain oxygen or non-lanthanoid metals, which are impurities that particularly easily adversely affect device properties. This can inhibit deterioration of device properties caused by admixture of these impurities during film formation.

Film-forming materials are usually supplied in a gas phase during a film-forming step. Conventional supply methods are a method of bubbling an inert gas in a material in a liquid state to cause a vapor of the film-forming material to accompany the inert gas (bubbling), and a method of dropping liquid drops of a film-forming material to generate a vapor (direct injection). In either supply method, the film-forming material should be in a liquid state at the temperature of the film-forming material vessel (for example, 20° C. room temperature or the heating temperature if the film-forming material vessel is heated). The temperature of the film-forming material vessel is often set at about 180° C. or lower in consideration of the thermal resistance of parts such as the vessel and valves. Therefore, the lanthanoid compound of the present application example, which has a melting point of 180° C. or lower, is especially advantageous as a material for forming a lanthanoid-containing thin film.

In the case that bubbling is used, a film-forming material having low reactivity with the gas introduced by bubbling is preferred. The lanthanoid compound according to the present application example is inert to the gas used for bubbling, namely, nitrogen, helium, or argon, at the temperature of the lanthanoid compound vessel subjected to bubbling. Therefore, the lanthanoid compound of the present application example is especially advantageous as a material for forming a lanthanoid-containing thin film.

Application Example 5

The lanthanoid compound of any one of Application Examples 1 to 4 may be a material for forming a lanthanoid-containing thin film by chemical vapor deposition or atomic layer deposition.

According to this application example, a conformal film having an even film thickness can be deposited. Because the quantity of the lanthanoid compound used for film formation can be controlled by controlling the supply temperature and the supply flow rate, the doping quantity can be controlled in the case that a lanthanoid element is doped in a thin film such as a GaN film.

Application Example 6

The lanthanoid-containing thin film according to the present application example is a lanthanoid-containing thin film formed by depositing a lanthanoid compound of any one of Application Examples 1 to 4 by chemical phase deposition or atomic layer deposition.

Application Example 7

A luminescent material according to the present application example is a luminescent material containing the lanthanoid-containing thin film according to Application Example 5.

Because it has an even film thickness and is conformal, the lanthanoid-containing thin film according to Application Example 5 has sufficient luminescent characteristics when used as a luminescent material.

Application Example 8

A method for forming a lanthanoid-containing thin film according to the present invention is a method for forming a lanthanoid-containing thin film, comprising:
a substrate introducing step for introducing a substrate into a chamber;
a lanthanoid compound introducing step for introducing a lanthanoid compound represented by the following general formula (1) or the following general formula (2) into the chamber in which the substrate was arranged; and
a film-forming step for forming at least some of the lanthanoid compound on the substrate so as to form the lanthanoid-containing thin film.

(1)

(In the general formula (1):
Ln is Nd, Eu, Dy, Tm, or Yb;
$R^1$ is independently methyl, ethyl, normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

(2)

(In the general formula (2):
$R^2$ is independently normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

Application Example 9

A mode of the method for forming a lanthanoid-containing thin film according to Application Example 7, in which the film-forming step is selected from among a group consisting of chemical vapor deposition (CVD), atomic layer deposition (ALD), plasma enhanced chemical vapor deposition (PECVD), plasma enhanced atomic layer deposition (PEALD), pulsed chemical vapor deposition (PCVD), low pressure chemical vapor deposition (LPCVD), subatmospheric chemical vapor deposition (SACVD), atmospheric pressure chemical vapor deposition (APCVD), spatial ALD, radical assisted film formation, supercritical fluid film formation, and combinations of these processes.

According to the present application example, a lanthanoid-containing thin film can be formed on a substrate.

Application Example 10

A mode of the method for forming a lanthanoid-containing thin film according to Application Example 8 or 9 also comprises a reaction gas introducing step for introducing a reaction gas containing at least one element selected from among a group consisting of oxygen, nitrogen, sulfur, and combinations of these elements into the chamber in which the substrate is arranged.

Application Example 11

In a mode of the method for forming a lanthanoid-containing thin film according to Application Example 10, the reaction gas may be selected from among a group consisting of water vapor, oxygen, ozone, nitrogen, ammonia, hydrogen sulfide, and combinations of these gases.

In the case that oxygen is introduced, a lanthanoid-containing oxide film containing oxygen can be formed in a lanthanoid-containing thin film. Similarly, in the case that nitrogen is introduced, a lanthanoid-containing nitride film can be formed, and in the case that sulfur is introduced, a lanthanoid-containing sulfide film can be formed. A heat treatment step for further heating the substrate may be disposed after these lanthanoid-containing thin films have been formed.

In the case that a reaction gas containing oxygen is introduced, a thin film comprising a trivalent lanthanoid oxide film is formed containing mainly $Nd_2O_3$, $Eu_2O_3$, $Dy_2O_3$, $Tm_2O_3$, $Yb_2O_3$, $Sm_2O_3$, or the like. In the case that a reaction gas containing no oxygen is introduced, however, a thin film containing mainly a divalent lanthanoid is apparently formed.

Application Example 12

A mode of the method for forming a lanthanoid-containing thin film according to either one of Application Example 10 or 11 is a method for forming a lanthanoid-containing thin film by carrying out a plurality of cycles alternating the lanthanoid compound introducing step and the reaction gas introducing step.

By repeatedly alternating a lanthanoid compound introducing step for introducing a lanthanoid compound into a chamber while controlling the flow rate and a reaction gas introducing step for introducing a reaction gas into a chamber while controlling the flow rate, atoms derived from the lanthanoid and the reaction gas can be layered on a substrate with good precision. A lanthanoid-containing thin film having a desired thickness can be obtained by repeating the lanthanoid compound introducing step and the reaction gas introducing step until the film thickness of the lanthanoid-containing thin film reaches the desired thickness.

Application Example 13

A mode of the method for forming a lanthanoid-containing thin film according to either one of Application Example 8 or 9 may also comprise a GaN-containing film-forming step for forming a GaN-containing film on the substrate, and the lanthanoid-containing thin film may contain a GaN layer containing lanthanoid atoms.

According to this application example, after a GaN layer has been formed on a substrate (a sapphire substrate on which a GaN film has been formed) (GaN-containing thin film-forming step), a lanthanoid compound is introduced into the chamber and a GaN layer containing a lanthanoid may be formed. The GaN layer may be obtained by introducing a Ga-containing material (for example, trimethylgallium) and a nitrogen-containing material (for example, ammonia) into the chamber while heating.

Application Example 14

In a mode of the method for forming a lanthanoid-containing thin film according to any one of Applications Examples 8 to 13, the film-forming step is a step carried out at a temperature of 0° C. to 1200° C.

Application Example 15

In a mode of the method for forming a lanthanoid-containing thin film according to any one of Applications Examples 8 to 14, the pressure in the chamber when carrying out the film-forming step is 0.06 Torr to atmospheric pressure.

SUMMARY

The lanthanoid compound according to the present invention has high stability and a melting point lower than the use temperature, and therefore can be used in a liquid state. The lanthanoid compound also has a sufficient vapor pressure and reactivity, and therefore is advantageous as a material for forming a lanthanoid-containing thin film.

According to the method for forming a lanthanoid-containing thin film according to the present invention, an even conformal lanthanoid-containing thin film can be formed. The resulting lanthanoid-containing thin film is useful as a luminescent material.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

EMBODIMENTS OF THE INVENTION

Advantageous embodiments of the present invention will be described in detail hereinafter. It should be understood that the present invention is not limited to only the embodiments described hereinafter, and may include various modifications without departing from the scope of the present invention.

Lanthanoid Compound

The lanthanoid compound according to the present invention is a compound represented by the following general formula (1).

$$\text{Ln}(R^1{}_x\text{Cp})_2(A)_y \tag{1}$$

(In the general formula (1):
Ln is Nd, Eu, Dy, Tm, or Yb;
$R^1$ is independently methyl, ethyl, normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

The lanthanoid compound according to the present invention is also a compound represented by the following general formula (2).

$$\text{Sm}(R^2{}_x\text{Cp})_2(A)_y \tag{2}$$

(In the general formula (2):
$R^2$ is independently normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.)

The lanthanoid compound of the general formula (1) or (2) may be any compound that has a valence of two and two cyclopentadienyl having two or three substituents. The two or three substituents on the two cyclopentadienyl of one lanthanoid compound may be all the same substituent or different substituents.

The lanthanoid Ln in the lanthanoid compound of the general formula (1) is Nd, Eu, Dy, Tm, or Yb depending on the application of the lanthanoid compound. For example, in the case that a lanthanoid-containing thin film formed using the lanthanoid compound is used as a luminescent material, europium for red, neodymium for green, etc. may be used to obtain a luminescent material of a desired color or a multicolor material.

The substituent on the cyclopentadienyl may be any C1-5 hydrocarbon, and may be a linear or branched substituent.

The number of substituents on the cyclopentadienyl may be two or three, and three substituents are especially advantageous. Specifically, a lanthanoid compound having a structure of Sm($^i$Pr$_3$Cp)$_2$, Eu($^i$Pr$_3$Cp)$_2$, Tm($^i$Pr$_3$Cp)$_2$, or Yb($^i$Pr$_3$Cp)$_2$ is more advantageous. A lanthanoid compound that does not form a polymer is advantageous.

In the case that the lanthanoid compound is an Sm compound as indicated by the general formula (2), the compound has especially high thermal stability and resists forming a polymer when heated when the number of substituents on the cyclopentadienyl is three or greater, which is advantageous.

The lanthanoid compound according to the present embodiment may have a linear or cyclic hydrocarbon comprising oxygen, sulfur, phosphorus, or nitrogen as an adduct. The adduct depends on factors such as the characteristics of the lanthanoid compound and the solvent used to synthesize the lanthanoid compound, and is not specifically limited. For example, one or two adducts may be selected from among a group consisting of $NMe_3$, $NEt_3$, $N^iPr_3$, $NMeEt_2$, $NC_5H_5$, $Me_2O$, $Et_2O$, $Et_2S$, $^nPr_2S$, THF, TMEDA, DME, $P(CH_3)_3$, piperidine, and $^nBu_2S$.

Synthesis of Lanthanoid Compound

The lanthanoid compound represented by the general formula (1) or the general formula (2) may be synthesized by combining a lanthanoid halide ($LnX_2$) (where X is a halogen) and a salt of an alkali metal with cyclopentadienyl having substituents ($M(R^1_xCp)$ or $M(R^2_xCp)$) (where M indicates an alkali metal) in an inert gas atmosphere.

The inert gas is not specifically limited provided that it is inert to the materials used in the synthesis reaction, and may be, for example, nitrogen, argon, helium, or a combination of these gases depending on the characteristics of the materials used.

The salt of an alkali metal with a cyclopentadienyl having substituents may be any salt with cyclopentadienyl that has the same substituents as the lanthanoid compound to be synthesized. The alkali metal may be any alkali metal that is stable in the presence of cyclopentadienyl having substituents, and is preferably potassium or sodium.

The salt of an alkali metal with a cyclopentadienyl having substituents may be obtained by reacting an alkali metal hydrogenate or an alkali metal amide with a cyclopentadienyl having substituents ($R^1_xCpH$) or ($R^2_xCpH$).

The alkali metal hydrogenate may be sodium hydrogenate or potassium hydrogenate.

The alkali metal amide may be $NaNH_2$, $Na[N(SiMe_3)_2]$, or $K[N(SiMe_3)_2]$.

Combining a lanthanoid halide and the salt of an alkali metal with a cyclopentadienyl having substituents obtained by this reaction obtains a crude product of the lanthanoid compound according to the present embodiment.

The lanthanoid halide ($LnX_2$) is preferably an anhydride, and more preferably, the lanthanoid halide ($LnX_2$) has a moisture content of 100 mass ppm or less. The lanthanoid halide ($LnX_2$) may be, for example, an iodide of Nd, Eu, Sm, Dy, Tm, or Yb. An ether-based, a hydrocarbon-based, or other reaction solvent may be used in this reaction. The reaction solvent is more preferably an ether-based solvent containing diethyl ether, THF, or dibutyl ether.

Next, the reaction solvent is replaced by an extraction solvent to filter and separate unreacted matter. The extraction solvent is preferably a solvent mixture of an ether with a saturated aliphatic hydrocarbon or an aromatic hydrocarbon.

The crude product $Ln(R^1_xCp)_2(A)_y$ or $Sm(R^2_xCp)_2(A)_y$ obtained by substituting an extraction solvent, then distilling the filtrate under reduced pressure is refined by distilling under reduced pressure to obtain a highly pure lanthanoid compound $Ln(R^1_xCp)_2(A)_y$ or $Sm(R^2_xCp)_2(A)_y$. The conditions of distillation under reduced pressure depend on the characteristics of the lanthanoid compound, and may be, for example, a distillation temperature of 160° C. to 230° C. The distillation pressure may be 0.001 torr to 1 torr.

Method for Forming Lanthanoid-Containing Thin Film

The lanthanoid compound according to the present embodiment may be used to form a film and obtain a lanthanoid-containing thin film on a substrate.

The substrate is not specifically limited provided that it has properties capable of growing a lanthanoid-containing thin film, and may be, for example, silicon, SiN, SiC, sapphire, or quartz depending on the application of the lanthanoid-containing thin film.

The method for forming a lanthanoid-containing thin film depends on the characteristics and application of the lanthanoid compound and is not specifically limited, and the film-forming step may be selected from among a group consisting of chemical vapor deposition (CVD), atomic layer deposition (ALD), plasma enhanced chemical vapor deposition (PECVD), plasma enhanced atomic layer deposition (PEALD), pulsed chemical vapor deposition (PCVD), low pressure chemical vapor deposition (LPCVD), subatmospheric chemical vapor deposition (SACVD), atmospheric pressure chemical vapor deposition (APCVD), spatial ALD, radical assisted film formation, supercritical fluid film formation, and combinations of these processes; among which, chemical vapor deposition (CVD) or atomic layer deposition (ALD) are more preferred.

Examples of methods for introducing a lanthanoid compound into a chamber in which a substrate has been disposed to form a lanthanoid-containing thin film are reducing the pressure in the chamber and aspiring, bubbling, or directly injecting a vapor of a lanthanoid compound packed in a lanthanoid compound vessel; however, the method may be any method that can supply the desired volume of vapor of a lanthanoid compound to a substrate, and is not limited to these methods.

The carrier gas used to accompany the vapor of a lanthanoid compound is not specifically limited provided that it is inert to the lanthanoid compound, and may be, for example, nitrogen, helium, or argon.

During CVD, after a substrate introducing step for introducing a substrate into a chamber, a film-forming step for forming a film of a lanthanoid compound on at least a portion of the substrate may be performed by introducing the lanthanoid compound into the chamber in which the substrate has been disposed so as to form a lanthanoid-containing thin film. A reaction gas introducing step for introducing a reaction gas into the chamber may also be performed to form a lanthanoid-containing thin film by causing a chemical reaction between the reaction gas and the lanthanoid compound.

During ALD, after a substrate introducing step for introducing a substrate into a chamber, a plurality of cycles may be performed alternating a lanthanoid compound introducing step for introducing a lanthanoid compound into the chamber and a reaction gas introducing step for introducing a reaction gas into the chamber. The lanthanoid compound introducing step and the reaction gas introducing step may be performed alternately until the film thickness of the lanthanoid-containing thin film has reached a desired thickness. A purge step for purging the vapor of the lanthanoid compound or the reaction gas from the chamber may be disposed between the lanthanoid compound introducing step and the reaction gas introducing step.

Figure 1:
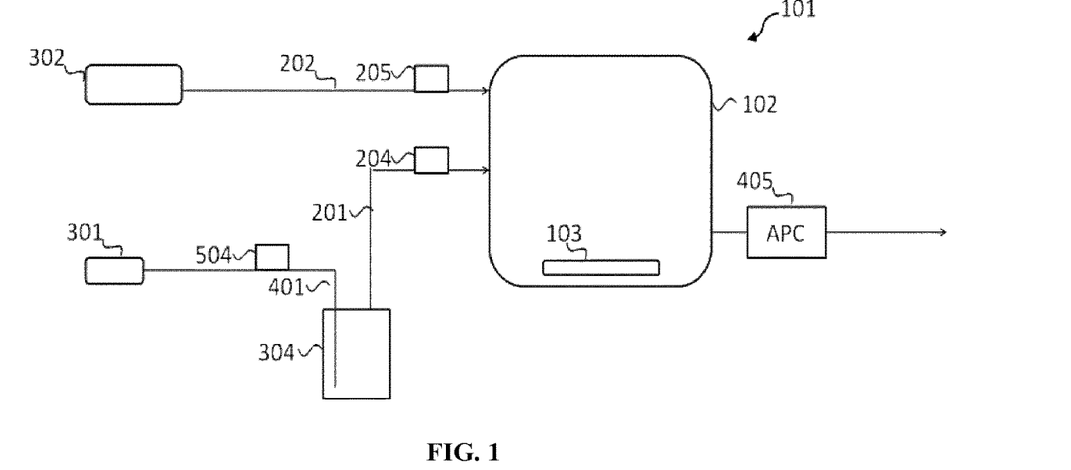
FIG. 1 is a schematic block diagram of an apparatus advantageously used in the present embodiment.
Figure 2:
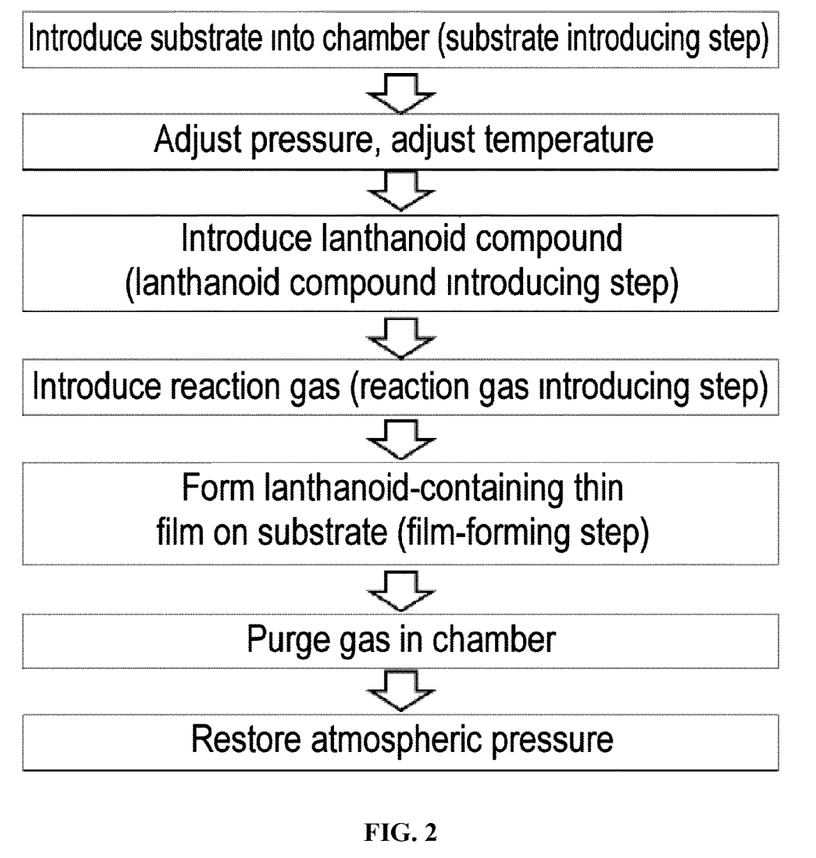
FIG. 2 is a diagram showing the flow of CVD according to the present embodiment.

The steps in the method for forming a lanthanoid-containing thin film according to the present embodiment will be described hereinafter while referring to the drawings. FIG. 1 is a schematic block diagram of a CVD apparatus advantageously used in the present embodiment. FIG. 2 is a diagram showing the flow of CVD according to the present embodiment.

Method for Forming Lanthanoid-Containing Thin Film: Substrate Introducing Step

As shown in FIG. 1, the substrate introducing step is a step for introducing a substrate 103 into a chamber 102 mounted in a film forming apparatus 101. At least one substrate 103 is introduced and arranged in the chamber 102. The chamber 102 is not specifically limited provided that it is chamber 102 for forming a film, and may be specifically, for example, a parallel-plate chamber, a cold-wall chamber, a hot-wall chamber, a single-wafer chamber, or a multi-wafer chamber.

The type of the substrate 103 for forming a lanthanoid-containing thin film differs depending on the final purpose of use. In several embodiments, the substrate may be selected from among an oxide used as a dielectric material in MIM, DRAM, or FeRam technology (for example, a $ZrO_2$-based material, an $HfO_2$-based material, a $TiO_2$-based material, a rare earth oxide-based material, or a three-dimensional oxide-based material) or a nitride-based layer used as an oxygen barrier between copper and a low-k layer (for example, TaN). Another substrate may be used during manufacture of a semiconductor device, a photovoltaic device, an LCD-TFT device, or a flat panel device. Examples of such a substrate are a solid substrate such as copper or a copper alloy such as CuMn, a metal nitride-containing substrate (for example, TaN, TiN, WN, TaCN, TiCN, TaSiN, and TiSiN), an insulator (for example, $SiO_2$, $Si_3N_4$, SiON, $HfO_2$, $Ta_2O_5$, $ZrO_2$, $TiO_2$, $Al_2O_3$, and barium-strontium titanate), or another substrate comprising an assembly of an arbitrary number of these materials, but is not limited to these examples. The actual substrate used is governed by the specific compound embodiment used. In many cases, however, a substrate preferred for use is selected from among Si substrates and $SiO_2$ substrates.

After the substrate 103 has been introduced into the chamber 102, the temperature and pressure in the chamber 102 are adjusted as required.

The temperature in the chamber 102 may be a temperature from 0° C. to 1200° C. In the case of ALD, for example, the lower limit of the temperature in the chamber 102 may be 0° C., preferably 20° C., and more preferably 50° C. The upper limit of the temperature in the chamber 102, for example, may be 300° C., preferably 200° C., and more preferably 150° C. In the case of CVD, for example, the lower limit of the temperature in the chamber 102 may be 100° C., preferably 200° C., and more preferably 300° C. The upper limit of the temperature in the chamber 102, for example, may be 1200° C., preferably 1100° C., and more preferably 1000° C.

In the case of ALD, the pressure in the chamber 102 may be 0.1 Torr to 100 Torr. In the case of CVD, the pressure may be 0.1 Torr to 500 Torr. The pressure in the chamber 102 is brought to a predetermined pressure by properly adjusting an APC valve 405 connected to the chamber 102.

The temperature in the chamber 102 may be controlled by controlling the temperature of a substrate holder holding the substrate 103, controlling the temperature of a wall of the chamber 102, or a combination of these methods. A conventional heating device may be used to heat the substrate 103.

Method for Forming Lanthanoid-Containing Thin Film: Lanthanoid Compound Introducing Step The lanthanoid compound introducing step is a step for introducing a lanthanoid compound into the chamber 102 in which the substrate 103 has been arranged. During this step, a vapor of the lanthanoid compound may be introduced accompanied by a carrier gas.

The carrier gas may be any gas that does not react in the chamber 102 with the lanthanoid compound represented by the general formula (1), and may be selected, for example, from among a group consisting of argon, helium, nitrogen, and combinations of these gases.

The flow rate of the lanthanoid compound introduced into the chamber 102 is controlled by a lanthanoid compound flow rate adjustment mechanism 204. The lanthanoid compound flow rate adjustment mechanism 204 is not specifically limited provided that it is a mechanism that controls the flow rate of the lanthanoid compound, and may be, for example, a mass-flow controller (hereafter "MFC"). The flow rate of the lanthanoid compound may be adjusted by adjusting the flow rate of the carrier gas introduced into a lanthanoid compound vessel 304 by a carrier gas flow rate adjustment mechanism 504 arranged above a carrier gas intake pipe 401 and before the lanthanoid compound vessel 304.

In the case that the lanthanoid compound is introduced accompanied by a carrier gas, the volume of the lanthanoid compound introduced into the chamber 102 may be measured together with the carrier gas flow rate and adjusted to a flow rate, for example, in a range of 0.1-2000 SCCM according to factors including the volume of the chamber 102, the characteristics of the lanthanoid compound, and the surface area of the substrate 103. In the case that the lanthanoid compound is introduced accompanied by a carrier gas, the concentration of the lanthanoid compound in the carrier gas differs depending on factors including the characteristics of the lanthanoid compound, and the temperature and the pressure of the chamber 102.

A vapor of the lanthanoid compound is supplied from the lanthanoid compound vessel 304 to the chamber 102. Although the vapor of the lanthanoid compound may be supplied by itself without accompanying a carrier gas, a carrier gas may be introduced into the lanthanoid compound vessel 304 to introduce the lanthanoid compound accompanied by the carrier gas. The carrier gas is not specifically limited provided that the carrier gas itself does not react with the lanthanoid compound, and may be, for example, a gas selected from among a group consisting of ammonia, inert gases, and combinations of these gases. Among these gases, an inert gas is more advantageous. The inert gas may be, for example, a gas selected from among a group consisting of helium, nitrogen, and a combination of these gases. Liquid drops containing the lanthanoid compound may be dropped onto a heater and introduced by a direct injection system for introducing the resulting vapor.

The lanthanoid compound vessel 304 may be heated using a conventional heating means as required to assure that the lanthanoid compound has a sufficient vapor pressure. The temperature at which the lanthanoid compound vessel 304 is kept is in a range of 0° C. to 180° C. depending on characteristics such as the thermal stability and the vapor pressure of the lanthanoid compound. A conventional bubbling vessel, cross-flow vessel, or the like may be used as the lanthanoid compound vessel 304.

A lanthanoid compound dissolved in an inert solvent may be introduced by a vaporizer (not shown) while controlling the flow rate by a liquid mass flow meter (that is, the lanthanoid compound flow rate adjustment mechanism 204). The vaporizer may be heated by a heating mechanism, and the heating temperature may be, for example, 170° C. to 350° C. depending on characteristics such as the vapor pressure and the thermal stability of the lanthanoid compound.

The lanthanoid compound may contain an adduct comprising a linear or cyclic hydrocarbon containing oxygen, sulfur, phosphorus, or nitrogen. The adduct is not specifically limited, and may be, for example, one or two adducts selected from among a group consisting of $NMe_3$, $NEt_3$, $N^iPr_3$, $NMeEt_2$, $NC_5H_5$, $Me_2O$, $Et_2O$, $Et_2S$, $^nPr_2S$, THF, DME, TMEDA, $P(CH_3)_3$, piperidine, and $^nBu_2S$. Containing an adduct increases the fluidity of the lanthanoid compound, which facilitates supplying the lanthanoid compound into the chamber 102.

Method for Forming Lanthanoid-Containing Thin Film: Reaction Gas Introducing Step A reaction gas introducing step may also be disposed in the present embodiment depending on factors including the characteristics of the desired lanthanoid-containing thin film. The reaction gas introduced into the chamber 102 during the reaction gas introducing step may be supplied from a reaction gas vessel 302 to a chamber 201, During this process, the flow rate of the reaction gas introduced into the chamber 102 is controlled by a reaction gas flow rate adjustment mechanism 205 arranged in a reaction gas feed pipe 202.

The reaction gas is not specifically limited provided that it contains at least one element selected from among a group consisting of nitrogen, sulfur, and a combination of these elements, and may be selected from among a group consisting of water vapor, oxygen, ozone, nitrogen, ammonia, hydrazine, hydrogen sulfide, and combinations of these depending on factors including the characteristics of the desired lanthanoid-containing thin film.

In the case that the reaction gas is a gas containing oxygen, the oxygen atom may be taken up into the lanthanoid-containing thin film to obtain an oxide film.

In the case that the reaction gas is a gas containing nitrogen, the nitrogen atom may be taken up into the lanthanoid-containing thin film to obtain a nitride film.

In the case that the reaction gas is a gas containing sulfur, the sulfur atom may be taken up into the lanthanoid-containing thin film to obtain a sulfide film.

In the case that the reaction gas is a gas containing oxygen and nitrogen, and in the case that the reaction gas is a gas mixture of a gas containing oxygen and a gas containing nitrogen, the oxygen and nitrogen atoms may be taken up into the lanthanoid-containing thin film to obtain an oxynitride film.

In the case of CVD, as shown by the flow in FIG. 2, the reaction gas introducing step may be performed after the lanthanoid compound introducing step, or the lanthanoid compound introducing step and the reaction gas introducing step may be performed simultaneously.

Figure 3:
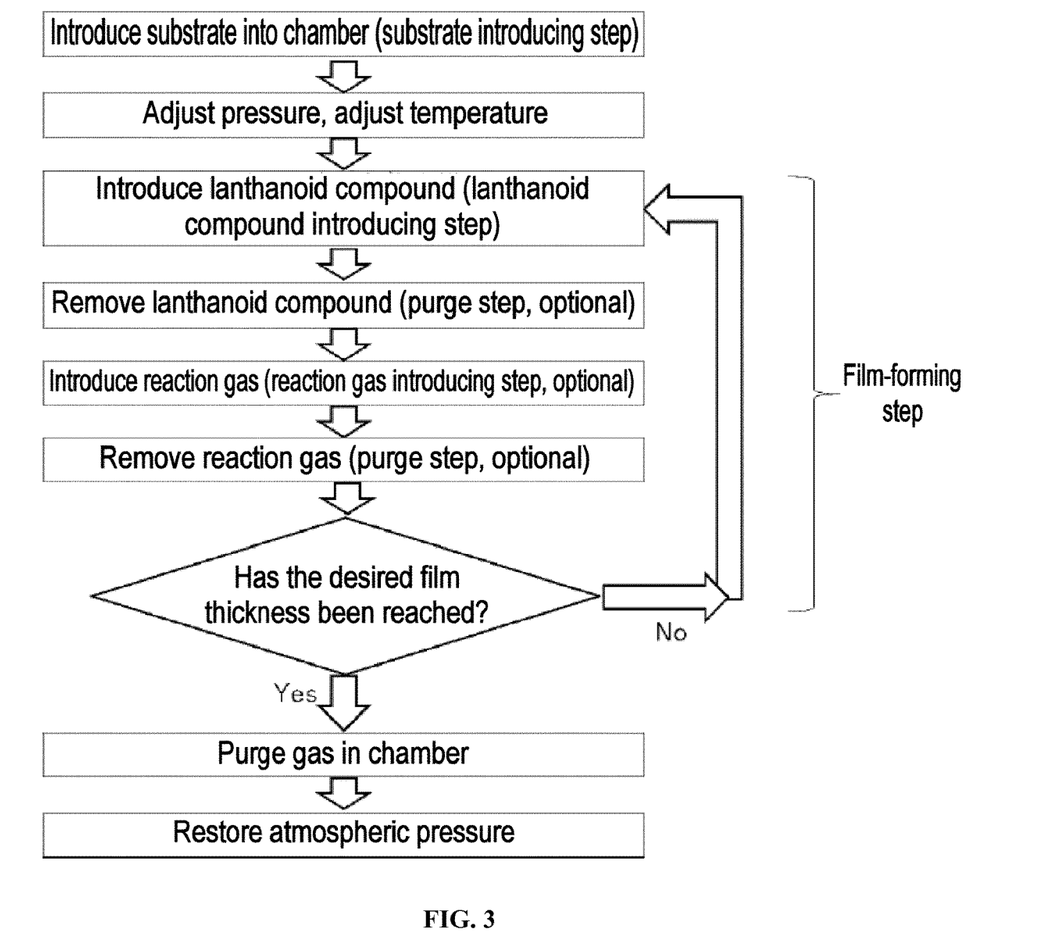
FIG. 3 is a diagram showing the flow of ALD according to the present embodiment.

In the case of ALD, as shown by the flow in FIG. 3, a flow may be repeated several times of performing the lanthanoid compound introducing step before performing a purge step for removing the lanthanoid compound from the chamber 102, then performing the reaction gas introducing step followed by a purge step for removing the reaction gas from the chamber 102 by purging.

These steps may be repeated until the film thickness of the lanthanoid-containing thin film formed reaches the desired thickness. In the case of ALD, the film-forming step for forming a lanthanoid compound is performed by repeating the lanthanoid compound introducing step and the reaction gas introducing step.

Figure 4:
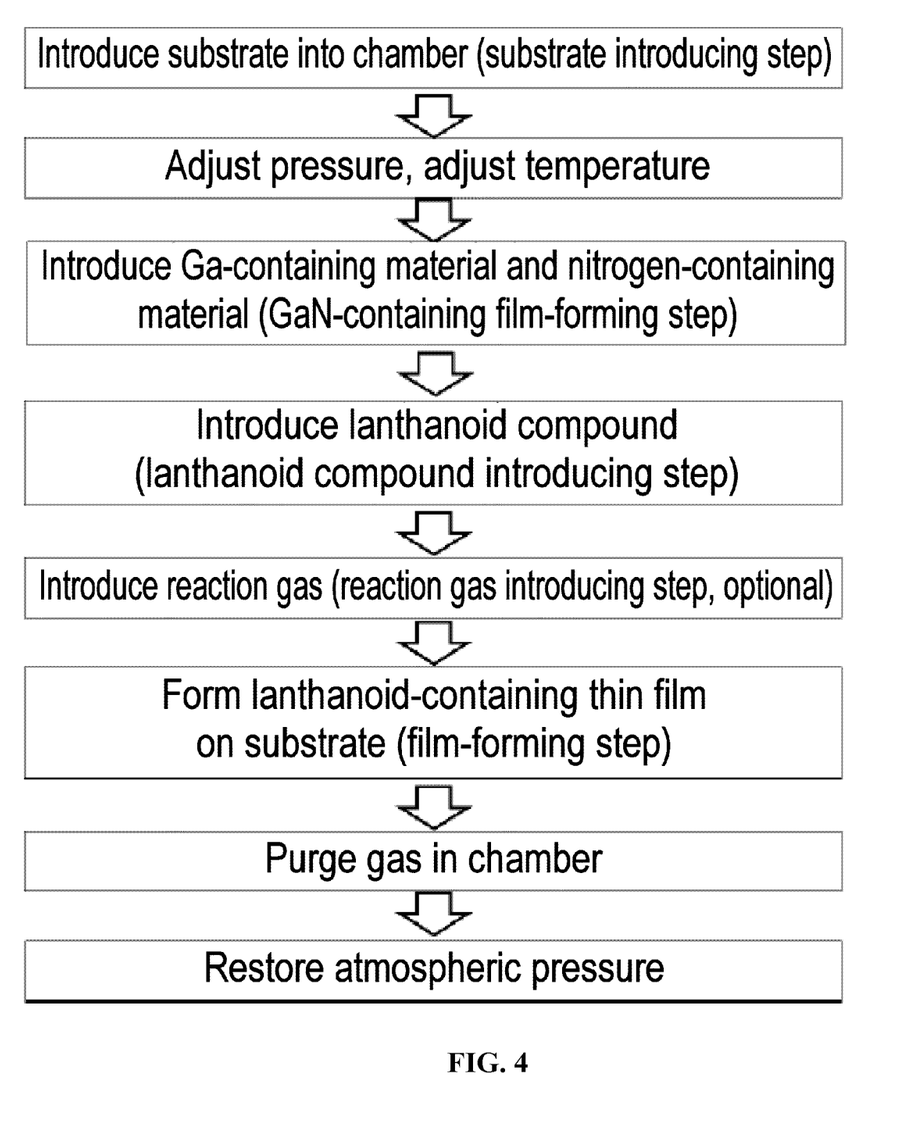
FIG. 4 is a diagram showing the flow of the film-forming method according to an embodiment containing a GaN-containing film-forming step.

In the case of formation of a lanthanoid-containing thin film comprising a GaN-containing film, as shown by the flow in FIG. 4, the lanthanoid compound introducing step may be performed after a GaN-containing film-forming step for forming a GaN layer on the substrate 103.

During this process, a sapphire substrate on which GaN has been formed may be used as the substrate 103.

Following a substrate introducing step for introducing the sapphire substrate into the chamber 102, a GaN-containing film-forming step is performed by introducing a Ga-containing material and a nitrogen-containing material into the chamber 102 to grow a GaN film. A carrier gas may be introduced during the GaN-containing film-forming step.

The carrier gas is not specifically limited provided that it is a gas that does not react with the Ga-containing material and a nitrogen-containing material, and may be, for example, argon or helium.

The Ga-containing material is not specifically limited provided that it is a material that contains Ga, and may be, for example, trimethylgallium or triethylgallium, The nitrogen-containing material is not specifically limited provided that it is a material that contains nitrogen, and may be, for example, ammonia or triethylamine.

Subsequently, the lanthanoid compound introducing step is performed to obtain a lanthanoid-containing thin film.

Method for Forming Lanthanoid-Containing Thin Film: Final Step

After a lanthanoid-containing thin film has been formed on the substrate 103, if a reaction gas was used with the lanthanoid compound, the chamber 102 is purged using the gas added. The pressure in the chamber 102 is returned to atmospheric pressure by the APC valve 405, the temperature in the chamber 102 is returned to room temperature by a temperature regulating mechanism, and the substrate 103 is removed.

Applications of Lanthanoid-Containing Thin Film

The lanthanoid-containing thin film obtained by film formation using a lanthanoid compound according to the present embodiment is not specifically limited, and may be used, for example, as a semiconductor device or a luminescent material.

In the case that the film is used as a luminescent material, the lanthanoid may be arbitrarily selected to obtain luminescent materials of different colors.

EXAMPLES

The present invention will be explained in greater detail hereinafter on the basis of examples, but the present invention is not to be taken as limited to these examples.

Example 1: Synthesis of $Eu(^iPr_3Cp)_2$

A 1-L volume flask was charged with 400 mL of dehydrated diethyl ether and 35.7 g (0.18 mol) of $K[N(SiMe_3)_2]$.

A solution of 38.1 g (0.20 mol, 1.1 equivalents) of $^i$Pr$_3$CpH dissolved in 100 mL of dehydrated diethyl ether was dropped into the flask at room temperature (a temperature of 20° C.).

After the resulting reaction mixture was stirred for 12 hours using a magnetic stirrer, the supernatant liquid was removed to obtain a precipitated white solid.

The white solid was washed with 100 mL of dehydrated diethyl ether and 100 mL of dehydrated n-pentane, then solidified under reduced pressure to obtain K($^i$Pr$_3$Cp).

After this was combined with 34.9 g (0.09 mol) of anhydrous EuI$_2$ and 500 mL of dehydrated THF and stirred for 48 hours at 20° C., the solvent (THF) was distilled off under reduced pressure to obtain an orange solid.

Next, the orange solid was combined with 500 mL of dehydrated n-pentane, and the orange filtrate was separated by filtration. The resulting filtrate was first solidified under reduced pressure at 20° C., then dried for three hours under reduced pressure at 120° C. to obtain a dark red liquid.

The resulting liquid was introduced into a single distillation apparatus, and a dark red liquid comprising the fraction at a temperature from 150° C. to 160° C. and a pressure of 10 Pa was obtained at a yield of 26.9 g (0.05 mol) and a yield rate of 58% (based on EuI$_2$).

The resulting Eu($^i$Pr$_3$Cp)$_2$ was subjected to composition analysis. ICP emission spectrometry of the liquid obtained by wet degradation revealed that the Eu content in Eu($^i$Pr$_3$Cp)$_2$ was 27.6%, This could be called a result close to the theoretical value of 28.4%. SPECTRO ARCOS II made by Hitachi High-Tech Science was used for the composition analysis.

Figure 5:
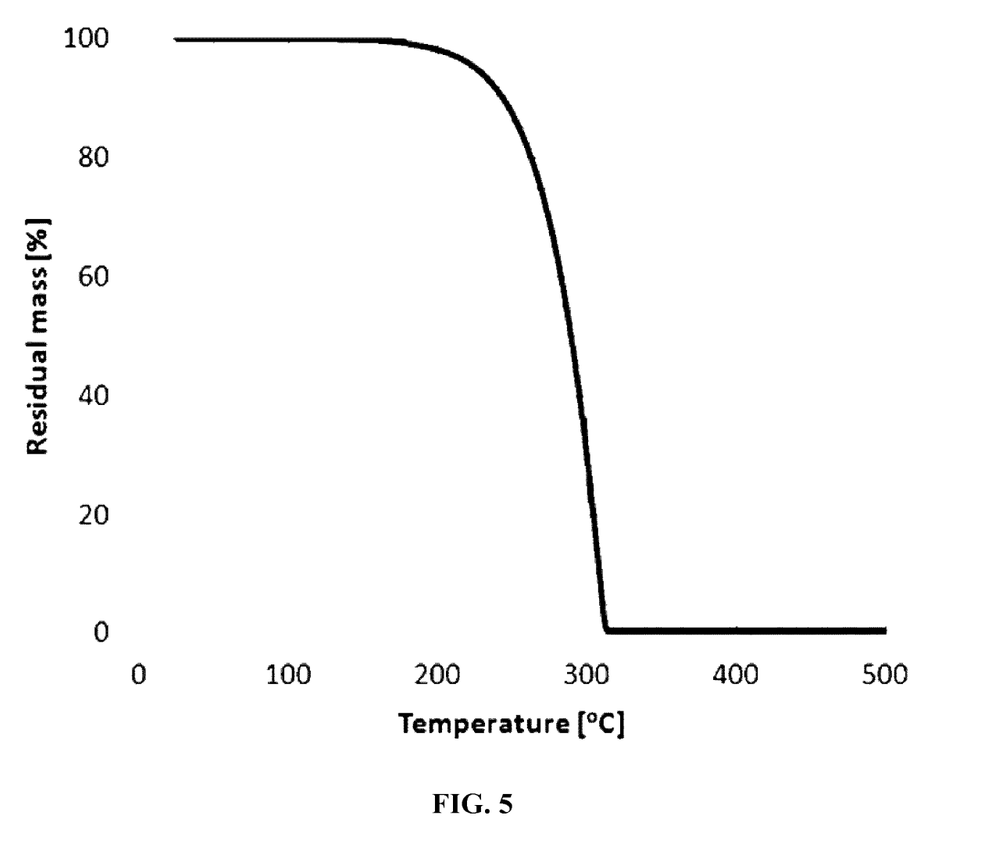
FIG. 5 shows the results of thermal analysis of Eu($^i$Pr$_3$Cp)$_2$ in Example 1.

FIG. 5 shows the results of thermal analysis of the resulting Eu($^i$Pr$_3$Cp)$_2$. The measurement conditions of the thermal analysis were TG-DTA measurement of a sample weight of 24.98 mg at a pressure of 1 atm in a nitrogen gas atmosphere at a temperature increase rate of 10.0° C./min. As shown by the solid line in FIG. 5, the residue during thermogravimetric analysis (TGA) was 0.4%.

When measured by isothermal thermogravimetric analysis, the vapor pressure of Eu($^i$Pr$_3$Cp)$_2$ was 1 torr at 180° C.

A TGA/SDTA 851 made by Mettler Toledo was used at the thermogravimetric analyzer.

As shown in FIG. 5, 99.6% of Eu($^i$Pr$_3$Cp)$_2$ was confirmed to have evaporated through 320° C. Based on this, Eu($^i$Pr$_3$Cp)$_2$ was confirmed to not thermally decompose or degenerate by forming a polymer at 320° C. or lower, and can be said to have high thermal stability as a lanthanoid-containing thin film.

Because it is a liquid at 20° C., Eu($^i$Pr$_3$Cp)$_2$ is easily supplied for film formation.

Because it has a sufficient vapor pressure at the temperature of 180° C. usually used during CVD or ALD, the compound can be said to be a lanthanoid compound capable of forming a lanthanoid-containing thin film at an advantageous film-forming speed.

The Eu($^i$Pr$_3$Cp)$_2$ obtained in Example 1 was a liquid at 20° C. However, Eu(Me$_4$EtCp)$_2$, which is a divalent Eu compound having cyclopentadienyl, has a melting point of 122.4° C. Based on this comparison, it was confirmed that a divalent lanthanoid compound having three substituents on cyclopentadienyl has a lower melting point than a divalent lanthanoid compound having five substituents on cyclopentadienyl.

Example 2: Synthesis of Yb($^i$Pr$_3$Cp)$_2$

A 250-mL volume flask was charged with 20 mL of dehydrated diethyl ether and 5.18 g (0.026 mol) of K[N(SiMe$_3$)$_2$]. A solution of 5.00 g (0.26 mol, 1.0 equivalent) of $^i$Pr$_3$CpH dissolved in 10 mL of dehydrated diethyl ether was dropped into the flask at room temperature (a temperature of 20° C.). After the resulting reaction mixture was stirred for 12 hours using a magnetic stirrer, the supernatant liquid was removed to obtain a precipitated white solid.

The white solid was solidified under reduced pressure to obtain K($^i$Pr$_3$Cp). After this was combined with 5.09 g (0.012 mol) of anhydrous YbI$_2$ and 50 mL of dehydrated THF and stirred for 48 hours at 20° C., the solvent (THF) was distilled off under reduced pressure to obtain a dark green solid.

Next, the dark green solid was combined with 100 mL of dehydrated n-pentane, and the green filtrate was separated by filtration.

The resulting filtrate was first solidified under reduced pressure at 20° C., then dried at 120° C. for three hours under reduced pressure to obtain a dark green liquid.

The resulting liquid was introduced into a single distillation apparatus, and a dark green solid (Yb($^i$Pr$_3$Cp)$_2$) comprising the fraction at a temperature from 150° C. to 160° C. and a pressure of 10 Pa was obtained at a yield of 3.9 g (7.50 mmol) and a yield rate of 59% (based on YbI$_2$).

The melting point of the resulting Yb($^i$Pr$_3$Cp)$_2$ was 75° C.

The resulting Yb($^i$Pr$_3$Cp)$_2$ was subjected to nuclear magnetic resonance (NMR). The structure of Yb($^i$Pr$_3$Cp)$_2$ was confirmed by $^1$H-NMR measurement using C$_6$D$_6$ as a deuterated solvent and tetramethylfuran as an internal standard. $^1$H-NMR (δ, C$_6$D$_6$, 400 MHz, 25° C.): δ5.69 (s, 4H), 2.93 (sept, J=7.2 Hz, 6H), 1.27 (m, 36H).

A 400 MHz NMR apparatus made by JEOL was used as the NMR analyzer.

Figure 6:
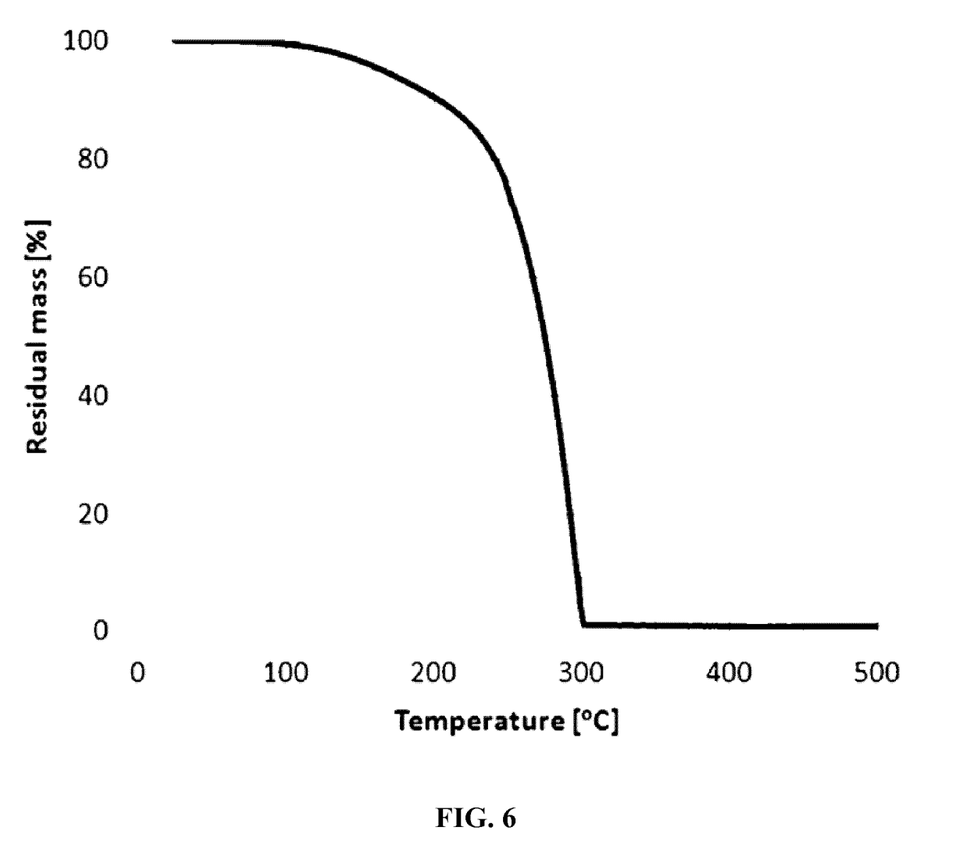
FIG. 6 shows the results of thermal analysis of Yb($^i$Pr$_3$Cp)$_2$ in Example 2.

FIG. 6 shows the results of thermal analysis of the resulting Yb($^i$Pr$_3$Cp)$_2$. The measurement conditions of the thermal analysis were TG-DTA measurement of a sample weight of 27.45 mg at a pressure of 1 atm in a nitrogen gas atmosphere at a temperature increase rate of 10.0° C./min. As shown by the solid line in FIG. 6, the residue during thermogravimetric analysis (TGA) was 1.3%.

When measured by isothermal thermogravimetric analysis, the vapor pressure of Yb($^i$Pr$_3$Cp)$_2$ was 1 torr at 177° C.

A TGA/SDTA 851 made by Mettler Toledo was used at the thermogravimetric analyzer.

As shown in FIG. 6, 98.7% of Yb($^i$Pr$_3$Cp)$_2$ was confirmed to have evaporated through 320° C. Based on this, Yb($^i$Pr$_3$Cp)$_2$ was confirmed to not thermally decompose or degenerate by forming a polymer at 320° C. or lower, and can be said to have high thermal stability as a lanthanoid-containing thin film.

Because it has a sufficient vapor pressure at the temperature of 180° C. usually used during CVD or ALD, the compound can be said to be a lanthanoid compound capable of forming a lanthanoid-containing thin film at an advantageous film-forming speed.

Comparative Example 1: Synthesis of Eu($^i$PrCp)$_2$

A 250-mL volume flask was charged with 40 mL of dehydrated diethyl ether and 4.00 g (0.020 mol) of K[N(SiMe$_3$)$_2$]. A solution of 2.40 g (0.022 mol, 1.1 equivalents) of $^i$PrCpH dissolved in 5 mL of dehydrated diethyl ether was dropped into the flask at room temperature (a temperature of 20° C.). After the resulting reaction mixture was stirred for 12 hours using a magnetic stirrer, the solvent was distilled off under reduced pressure to obtain K($^i$PrCp). After a 250-mL volume flask prepared separately was charged with 3.20 g (0.008 mol) of anhydrous EuI$_2$, 2.3 g (0.016 mol) of the synthesized K($^i$PrCp), and 20 mL of dehydrated THF and of the synthesized K($^i$PrCp), 20 mL of dehydrated THF, and 75 mL of diethyl ether were added and stirred for 48 hours at 20° C., and the supernatant stirred for 48 hours at 20° C., the supernatant liquid was separated by filtration. The resulting filtrate was first solidified under reduced pressure at 20° C., then solidified under reduced pressure. Next, the solid was dried for three hours under reduced pressure at 100° C. to obtain an orange solid (Eu($^i$PrCp)$_2$) at a yield of 1.6 g (4.40 mol) and a yield rate of 55% (based on EuI$_2$).

Example 3: Formation of Yb$_2$O$_3$ Film by CVD Using Yb($^i$Pr$_3$Cp)$_2$

A lanthanoid-containing thin film was formed on a substrate by hot CVD under the following conditions using Yb($^i$Pr$_3$Cp)$_2$ as the lanthanoid compound and dry air as the reaction gas. A gas mixture of nitrogen and oxygen containing 20% to 22% oxygen and having a dew point of −69° C. was used as the dry air.

Film Formation Conditions

Apparatus used: An apparatus 101 having the configuration shown schematically in FIG. 1 was used. The substrate 103 was arranged in the chamber 102. The lanthanoid compound vessel 304 filled with Yb($^i$Pr$_3$Cp)$_2$ was connected to the carrier gas intake pipe 401 and the lanthanoid compound feed pipe 201, which was connected to the chamber 102. Nitrogen gas as the carrier gas 301 was introduced through the carrier gas intake pipe 401 into the lanthanoid compound vessel 304 to bubble the nitrogen gas in the Yb($^i$Pr$_3$Cp)$_2$. A mass flow meter was arranged above the lanthanoid compound feed pipe 201 as the lanthanoid compound flow rate adjustment mechanism 204. The reaction gas vessel 302 filled with air was connected to the reaction gas feed pipe 202, which was connected to the chamber 102. A mass flow meter was arranged above the reaction gas feed pipe 202 as a reaction gas flow rate adjustment mechanism 205.

A lanthanoid compound introducing step for introducing Yb($^i$Pr$_3$Cp)$_2$ into the chamber accompanied by the carrier gas, and a reaction gas introducing step for introducing air into the chamber 102 were performed simultaneously to perform a film-forming step for forming a lanthanoid-containing thin film.

Lanthanoid compound: Yb($^i$Pr$_3$Cp)$_2$
Substrate: SiO$_2$ (cleaned with HF)
Film formation temperature: 700° C.
Pressure inside chamber: 10 Torr
Temperature of lanthanoid compound vessel 304: 140° C.
Carrier gas 301: Nitrogen gas (flow rate: 50 SCCM)
Reaction gas: Air (flow rate: 30 SCCM)
Film formation time: 60 minutes

Example 4: Formation of Eu-containing GaN Film by MOCVD Using Eu($^i$Pr$_3$Cp)$_2$ A lanthanoid-containing thin film containing a GaN layer was formed by MOCVD under the following conditions using Eu($^i$Pr$_3$Cp)$_2$.

Film Formation Conditions

Apparatus used: An MOCVD apparatus was used. A sapphire substrate on which a GaN film had been formed was arranged in a MOCVD chamber. A carrier gas intake pipe for introducing nitrogen gas comprising a carrier gas was connected to a lanthanoid compound vessel filled with Eu($^i$Pr$_3$Cp)$_2$. A lanthanoid compound feed pipe for supplying a vapor of Eu($^i$Pr$_3$Cp)$_2$ accompanied by the carrier gas to the MOCVD chamber was also connected to the lanthanoid compound vessel. Nitrogen gas as the carrier gas was introduced through the carrier gas intake pipe into the lanthanoid compound vessel to bubble the nitrogen gas in the Eu($^i$Pr$_3$Cp)$_2$. The flow rate of the nitrogen gas was adjusted by a carrier gas flow rate adjustment mechanism arranged above the carrier gas intake pipe. Pipes for supplying a Ga-containing material, a nitrogen-containing material, and the carrier gas (nitrogen gas) were connected to the MOCVD chamber.

Next, the sapphire substrate on which a GaN film had been formed was heated to 1000° C. while nitrogen was supplied to the MOCVD chamber. During this heating, a gas mixture of nitrogen and ammonia may be supplied to the MOCVD chamber, or only ammonia gas may be supplied. Similar results are obtained using either gas.

Next, trimethylgallium comprising a Ga-containing material and ammonia comprising a nitrogen-containing material were both introduced into the MOCVD chamber and a GaN-containing film-forming step was performed for five minutes.

After the GaN-containing film-forming step ended, the lanthanoid compound was supplied to the MOCVD chamber and a film-forming step was performed for 30 minutes. Eu($^i$Pr$_3$Cp)$_2$ was supplied to the reactor for 30 minutes, and an Eu-containing thin film containing a GaN layer comprising a lanthanoid-containing thin film containing a GaN layer was formed.

Lanthanoid compound: Eu($^i$Pr$_3$Cp)$_2$ (flow rate: 0.004 SCCM)
Substrate: Sapphire substrate on which a GaN film had been formed
Film formation temperature: 1000° C.
Pressure inside chamber: 450 Torr
Temperature of lanthanoid compound vessel 304: 140° C.
Ga-containing material: Trimethylgallium (flow rate: 0.2 SCCM)
Nitrogen-containing material: Ammonia (flow rate: 600 SCCM)
Time required by GaN-containing film-forming step: 5 minutes
Film formation time during film-forming step: 30 minutes

Example 5: Formation of Yb$_2$O$_3$ Film by ALD Using Yb($^i$Pr$_3$Cp)$_2$

A lanthanoid-containing thin film was formed on a substrate by ALD under the following conditions using Yb($^i$Pr$_3$Cp)$_2$ as the lanthanoid compound and water vapor as the reaction gas.

Film Formation Conditions

Apparatus used: An apparatus 101 having the configuration shown schematically in FIG. 1 was used. The substrate 103 was arranged in the chamber 102. The lanthanoid compound vessel 304 filled with Yb($^i$Pr$_3$Cp)$_2$ was connected to the carrier gas intake pipe 401 and the lanthanoid compound feed pipe 201, which was connected to the chamber 102. Argon gas as the carrier gas 301 was introduced through the carrier gas intake pipe 401 into the lanthanoid compound vessel 304 to bubble the argon gas in the Yb($^i$Pr$_3$Cp)$_2$. A mass flow meter was arranged above the lanthanoid compound feed pipe 201 as the lanthanoid compound flow rate adjustment mechanism 204. The reaction gas vessel 302 filled with water was connected to the reaction gas feed pipe 202, which was connected to the chamber 102. The water was introduced into the chamber 102 in a gas phase accompanied by the argon gas. A mass flow meter was arranged above the reaction gas feed pipe 202 as a reaction gas flow rate adjustment mechanism 205.

A lanthanoid compound introducing step for introducing Yb($^i$Pr$_3$Cp)$_2$ into the chamber 102 for one second accompanied by argon gas comprising a carrier gas, and a reaction gas introducing step for introducing water into the chamber 102 for one second accompanied by argon gas were performed alternately with a three-second purge step in between.

Specifically, 100 cycles were performed in which one cycle consisted of performing the lanthanoid compound introducing step for one second, then performing the purge step for three seconds, the reaction gas introducing step for one second, and the purge step for three seconds.

Lanthanoid compound: Yb($^i$Pr$_3$Cp)$_2$
Substrate: SiO$_2$ (cleaned with HF)
Film formation temperature: 300° C.
Pressure inside chamber: 5 Torr
Temperature of lanthanoid compound vessel 304: 120° C.
Carrier gas: Argon gas (flow rate: 50 SCCM)
Reaction gas: Water (accompanied by argon gas introduced at 200 SCCM)
Temperature of reaction gas vessel 302: 20° C.

Analysis by XPS of the resulting lanthanoid-containing thin film confirmed that a Yb$_2$O$_3$ film was obtained comprising a lanthanoid compound having a film thickness of 10 nm.

Example 6: Formation of Eu$_2$O$_3$ Film by ALD Using Eu($^i$Pr$_3$Cp)$_2$

A lanthanoid-containing thin film was formed on a substrate by ALD under the following conditions using Eu($^i$Pr$_3$Cp)$_2$ as the lanthanoid compound and oxygen as the reaction gas.

Film Formation Conditions

Apparatus used: An apparatus 101 having the configuration shown schematically in FIG. 1 was used. The substrate 103 was arranged in the chamber 102. The lanthanoid compound vessel 304 filled with Eu($^i$Pr$_3$Cp)$_2$ was connected to the carrier gas intake pipe 401 and the lanthanoid compound feed pipe 201, which was connected to the chamber 102. Nitrogen gas as the carrier gas 301 was introduced through the carrier gas intake pipe 401 into the lanthanoid compound vessel 304 to bubble the oxygen gas in the Eu($^i$Pr$_3$Cp)$_2$. A mass flow meter was arranged above the lanthanoid compound feed pipe 201 as the lanthanoid compound flow rate adjustment mechanism 204. The reaction gas vessel 302 filled with oxygen was connected to the reaction gas feed pipe 202, which was connected to the chamber 102. A mass flow meter was arranged above the reaction gas feed pipe 202 as a reaction gas flow rate adjustment mechanism 205.

A lanthanoid compound introducing step for introducing Eu($^i$Pr$_3$Cp)$_2$ into the chamber 102 for one second accompanied by nitrogen comprising a carrier gas, and a reaction gas introducing step for introducing oxygen into the chamber 102 for one second were performed alternately with a three-second purge step in between.

Specifically, 600 cycles were performed in which one cycle consisted of performing the lanthanoid compound introducing step for 16 seconds, then performing the purge step for 16 seconds, the reaction gas introducing step for four seconds, and the purge step for four seconds.

Lanthanoid compound: Eu($^i$Pr$_3$Cp)$_2$
Substrate: Si (cleaned with HF)
Film formation temperature: 225° C.
Pressure inside chamber: 20 Torr
Temperature of lanthanoid compound vessel 304: 140° C.
Carrier gas: Nitrogen gas (flow rate: 20 SCCM)
Reaction gas: Oxygen (accompanied by nitrogen gas introduced at 20 SCCM)
Temperature of reaction gas vessel 302: 20° C.

DESCRIPTION OF THE REFERENCE NUMERALS

101 Film forming apparatus
102 Chamber
103 Substrate
201 Lanthanoid compound feed pipe
202 Reaction gas feed pipe
204 Lanthanoid compound flow rate adjustment mechanism
205 Reaction gas flow rate adjustment mechanism
301 Carrier gas
302 Reaction gas vessel
304 Lanthanoid compound vessel
401 Carrier gas intake pipe
405 APC valve (pressure regulation portion)
504 Carrier gas flow rate adjustment mechanism While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

The invention claimed is:

1. A lanthanoid compound represented by the following general formula (2)

$$Sm(R^2{}_xCp)_2(A)_y \quad (2)$$

wherein:
$R^2$ is independently normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.

2. The lanthanoid compound of claim 1, wherein the lanthanoid compound is incorporated into a composition suitable as a material for forming a lanthanoid-containing thin film for production of a semiconductor device.

3. The lanthanoid compound of claim 2, wherein the lanthanoid compound is incorporated into a composition suitable as a material for forming a lanthanoid-containing thin film by chemical vapor deposition or atomic layer deposition.

4. A lanthanoid compound selected from a group consisting of $Sm(^iPr_3Cp)_2$, $Eu(^iPr_3Cp)_2$, $Tm(^iPr_3Cp)_2$, or $Yb(^iPr_3Cp)_2$, wherein $^iPr$ is isopropyl.

5. The lanthanoid compound of claim 4, wherein the lanthanoid compound is incorporated into a composition suitable as a material for forming a lanthanoid-containing thin film for production of a semiconductor device.

6. A method for forming a lanthanoid-containing thin film, comprising:
a substrate introducing step for introducing a substrate into a chamber;
a lanthanoid compound introducing step for introducing a lanthanoid compound selected from a group consisting of $Eu(^iPr_3Cp)_2$, $Tm(^iPr_3Cp)_2$, $Yb(^iPr_3Cp)_2$, wherein $^iPr$ is isopropyl, or a lanthanoid compound represented by the following general formula (2) into the chamber in which the substrate was arranged; and
a film-forming step for forming at least some of the lanthanoid compound on the substrate so as to form the lanthanoid-containing thin film, wherein the general formula (2) is $Sm(R_x{}^2Cp)_2(A)_y$, and wherein:

$R^2$ is independently normal propyl, isopropyl, normal butyl, secondary butyl, isobutyl, or tertiary amyl;
Cp is cyclopentadienyl;
A is a linear or cyclic hydrocarbon containing oxygen, sulfur, phosphorus, or nitrogen;
x is an integer of 2 to 3; and
y is 0 to 2.

7. The method for forming a lanthanoid-containing thin film as claimed in claim 6, wherein the film-forming step is selected from among a group consisting of chemical vapor deposition (CVD), atomic layer deposition (ALD), plasma enhanced chemical vapor deposition (PECVD), plasma enhanced atomic layer deposition (PEALD), pulsed chemical vapor deposition (PCVD), low pressure chemical vapor deposition (LPCVD), subatmospheric chemical vapor deposition (SACVD), atmospheric pressure chemical vapor deposition (APCVD), spatial ALD, radical assisted film formation, supercritical fluid film formation, and combinations of these processes.

8. The method for forming a lanthanoid-containing thin film as claimed in claim 7, also comprising a reaction gas introducing step for introducing a reaction gas containing at least one element selected from among a group consisting of oxygen, nitrogen, sulfur, and combinations of these elements into the chamber in which the substrate is arranged.

9. The method for forming a lanthanoid-containing thin film as claimed in claim 8, characterized in that the reaction gas is selected from among a group consisting of water vapor, oxygen, ozone, nitrogen, ammonia, hydrogen sulfide, and combinations of these gases.

10. The method for forming a lanthanoid-containing thin film as claimed in claim 8, characterized in that a plurality of cycles is carried out alternating the lanthanoid compound introducing step and the reaction gas introducing step.

11. The method for forming a lanthanoid-containing thin film as claimed in claim 6, characterized by also comprising a GaN-containing film-forming step for forming a GaN-containing film on the substrate, and the lanthanoid-containing thin film comprising a GaN layer containing lanthanoid atoms.

12. The method for forming a lanthanoid-containing thin film of claim 6, wherein the film-forming step is a step carried out at a temperature of 0° C. to 1200° C.

13. The method for forming a lanthanoid-containing thin film of claim 6, wherein the pressure in the chamber is 0.06 Torr to atmospheric pressure.

* * * * *